US007411157B2

(12) United States Patent
Brunner et al.

(10) Patent No.: US 7,411,157 B2
(45) Date of Patent: Aug. 12, 2008

(54) ELECTRONIC FLAME-OFF ELECTRODE WITH BALL-SHAPED TIP

(75) Inventors: Jon Brunner, Sellersville, PA (US); Horst Clauberg, Lafayette Hill, PA (US); John Shuhart, Warminster, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 23 days.

(21) Appl. No.: 11/053,499

(22) Filed: Feb. 8, 2005

(65) Prior Publication Data

US 2006/0076337 A1 Apr. 13, 2006

Related U.S. Application Data

(63) Continuation-in-part of application No. 10/948,905, filed on Sep. 24, 2004.

(51) Int. Cl.
*B23K 35/04* (2006.01)
(52) U.S. Cl. .............................. 219/145.21; 219/56.21; 228/4.5
(58) Field of Classification Search ............. 219/56.21, 219/56.22, 137 R, 69.7, 69.2, 145.21; 228/180.5, 228/4.5
See application file for complete search history.

(56) References Cited

U.S. PATENT DOCUMENTS

| 1,850,819 | A | | 3/1932 | Waltenberg et al. | |
|---|---|---|---|---|---|
| 2,274,631 | A | * | 2/1942 | Russell | 219/75 |
| 2,342,086 | A | * | 2/1944 | Russell | 219/75 |
| 2,784,301 | A | * | 3/1957 | Landis et al. | 219/137 R |
| 3,003,050 | A | * | 10/1961 | Correy | 219/75 |
| 3,950,631 | A | | 4/1976 | Schmidt et al. | |
| 4,098,447 | A | | 7/1978 | Edson et al. | |
| 4,387,283 | A | | 6/1983 | Peterson et al. | |
| 4,572,772 | A | | 2/1986 | Peterson | |
| 4,594,493 | A | | 6/1986 | Harrah et al. | |
| 5,185,922 | A | | 2/1993 | Pendley et al. | |
| 5,277,354 | A | | 1/1994 | Farassat | |
| 5,290,281 | A | * | 3/1994 | Tschakaloff | 606/28 |
| 5,616,257 | A | * | 4/1997 | Harada et al. | 219/56.21 |
| 5,628,922 | A | * | 5/1997 | Chen | 219/56.21 |
| 6,062,462 | A | | 5/2000 | Gillotti et al. | |
| 6,307,307 | B1 | | 10/2001 | Kanao | |
| 6,770,833 | B2 | * | 8/2004 | Yang | 219/56.21 |
| 6,784,394 | B2 | * | 8/2004 | Nishiura | 219/56.22 |

OTHER PUBLICATIONS

Experimental Study of EFO Ward Electrode Wear, Surface Pollution, and Discharge Gaps in Wire Bonding Process; Tamkang Journal of Science and Engineering, vol. 6, No. 1, pp. 43-48 (2003).

* cited by examiner

*Primary Examiner*—Kevin P. Kerns
(74) *Attorney, Agent, or Firm*—Christopher M. Spletzer, Sr.

(57) ABSTRACT

An electrode for a wire bonding apparatus is provided. The electrode includes a body portion and a tip portion adjacent the body portion. The tip portion has a substantially spherical configuration.

18 Claims, 4 Drawing Sheets

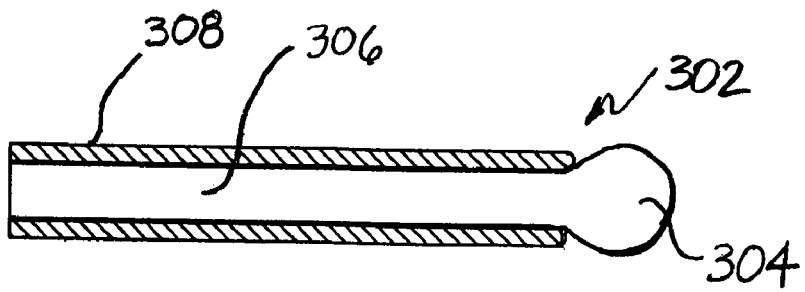
FIG. 6
| | Run #1 | Run #2 | |
|---|---|---|---|
| average | 37.9 | 37.6 | μm |
| std dev. | 0.25 | 0.23 | μm |
| max | 38.95 | 38.68 | μm |
| min | 37.23 | 37.03 | μm |
| range | 1.72 | 1.65 | μm |
| # balls | 400.00 | 400.00 | |
FIG. 7
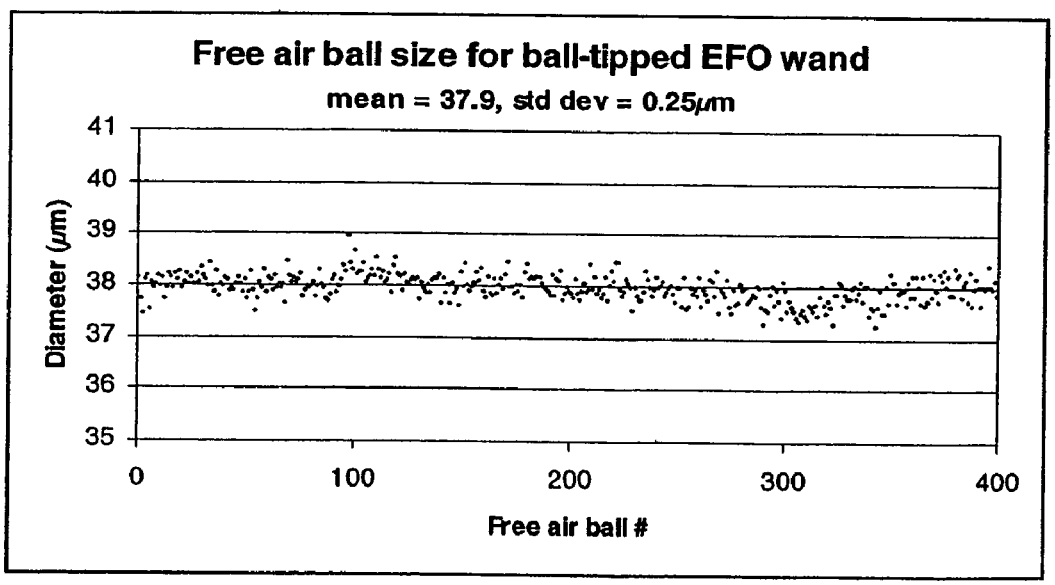
FIG. 8

ELECTRONIC FLAME-OFF ELECTRODE WITH BALL-SHAPED TIP

CROSS-REFERENCE TO RELATED APPLICATION

This is a continuation-in-part of application Ser. No. 10/948,905, filed Sep. 24, 2004 (entitled "FINE PITCH ELECTRONIC FLAME-OFF WAND ELECTRODE"), which is incorporated by reference in its entirety.

FIELD OF THE INVENTION

The present invention relates to wire bonding apparatus, and more particularly, to an electrode of an electronic flame-off (EFO) wand for a wire bonding apparatus.

BACKGROUND OF THE INVENTION

A conventional wire bonding apparatus 100 is depicted in FIG. 1. The apparatus includes an electrical flame-off (EFO) wand 104, a bonding wire 108, which is fed through a wire damper 112 and a capillary 116. The wire damper 112 and the capillary 116 are parts of what is typically referred to as a bond head assembly (the bond head assembly may include other components such as, for example, an ultrasonic transducer). A ball 120 is formed at the end of the wire 108 that protrudes from the narrow end of the capillary 116. The apparatus 100 also includes a lead frame 122 having leads 124 and 128. A semiconductor integrated circuit or die 132 is mounted on the lead frame 122 and forms a die-lead frame assembly. The die 132 includes bond pads 136 and 140. A wire 144 is bonded to the pad 140 and the lead 124. The apparatus 100 also includes a lead frame holder 148, which secures the die-lead frame assembly during wire bonding, and an electrical discharge generator 152 coupled to the wire damper 112 and the EFO wand 104. The electrical discharge generator creates an electrical discharge in response to receiving a discharge signal.

Bonding the wire 108 to the die 140 and the lead frame 122 is accomplished using the bond head. The bond head generally moves in the x, y, and z directions above the die-lead frame assembly.

Conventionally, the ball 120 on the end of the wire 108 is formed by placing the electrical flame-off (EFO) wand 104 a predetermined distance from the end of the wire 108. An electrical arc is emitted between the end of the wire 108 and the EFO wand 104. The arc forms the ball 120 on the end of the spool of bonding wire 108. By varying the intensity and the duration of the electrical arc, the size of the ball that is formed can be adjusted to specific dimensions.

FIG. 2 depicts a prior art EFO wand 104, which includes a mounting section 164, epoxy 168, and an electrode 172. The mounting section 164 is both rigid and electrically conductive. The epoxy 168 is electrically conductive and secures the electrode 172 to the mounting section 164. As discussed above, the electrode 172 emits an electrical discharge or arc from a tip 176 to the end of a bonding wire 108 to form a ball 120. The electrode 172 is formed from a rigid and electrically conductive material. Typical electrodes 172 are made of platinum having a purity of 99.95%. The diameter of a typical electrode is 0.020 inches.

It has been determined that, during use, a certain amount of carbon contamination forms on the EFO electrode each time a bonding ball 120 is formed. The carbon contamination acts as an insulator. As such, build up of carbon contamination interferes with the normal functioning of the electrode tip 176. As the carbon contaminates the electrode, it gradually degrades the quality of the bonding balls that are formed. A variety of other contaminants also build up on the wand and interfere with the ball formation process in a similar manner.

Mechanical scraping of the electrode tip 176 is one possible method of removing the contamination which has been deposited. However, this method has serious drawbacks in that continual mechanical adjustments would be required to avoid excessive damage to electrode tip 176. Additionally, a mechanical apparatus for scraping the electrode tip would desirably be located on the automated ball bonding machinery near the normal operating position of the electrode 172, a location where space is already at a premium. Therefore, it would be desirable to provide an improved method or design for cleaning an electrode of an EFO wand.

SUMMARY OF THE INVENTION

According to an exemplary embodiment of the present invention, an electrode for a wire bonding apparatus is provided. The electrode includes a body portion and a tip portion adjacent the body portion. The tip portion has a substantially spherical configuration.

According to another exemplary embodiment of the present invention, an electrode for a wire bonding apparatus is provided. The electrode includes a body portion and a tip portion adjacent the body portion. The tip portion defines an outer surface having a diameter that is greater than a diameter of an outer surface defined by the body portion.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown. In the drawings:

FIG. 6 is an electrode having a ball-shaped tip in accordance with an exemplary embodiment of the present invention.

FIG. 7 is a graphical illustration of ball diameter for a first and second run of 400 free-air balls formed by an EFO wand including the electrode of FIG. 6.

FIG. 8 is a table including the results of the first run of FIG. 7.

DETAILED DESCRIPTION OF THE DRAWINGS

Figure 1:
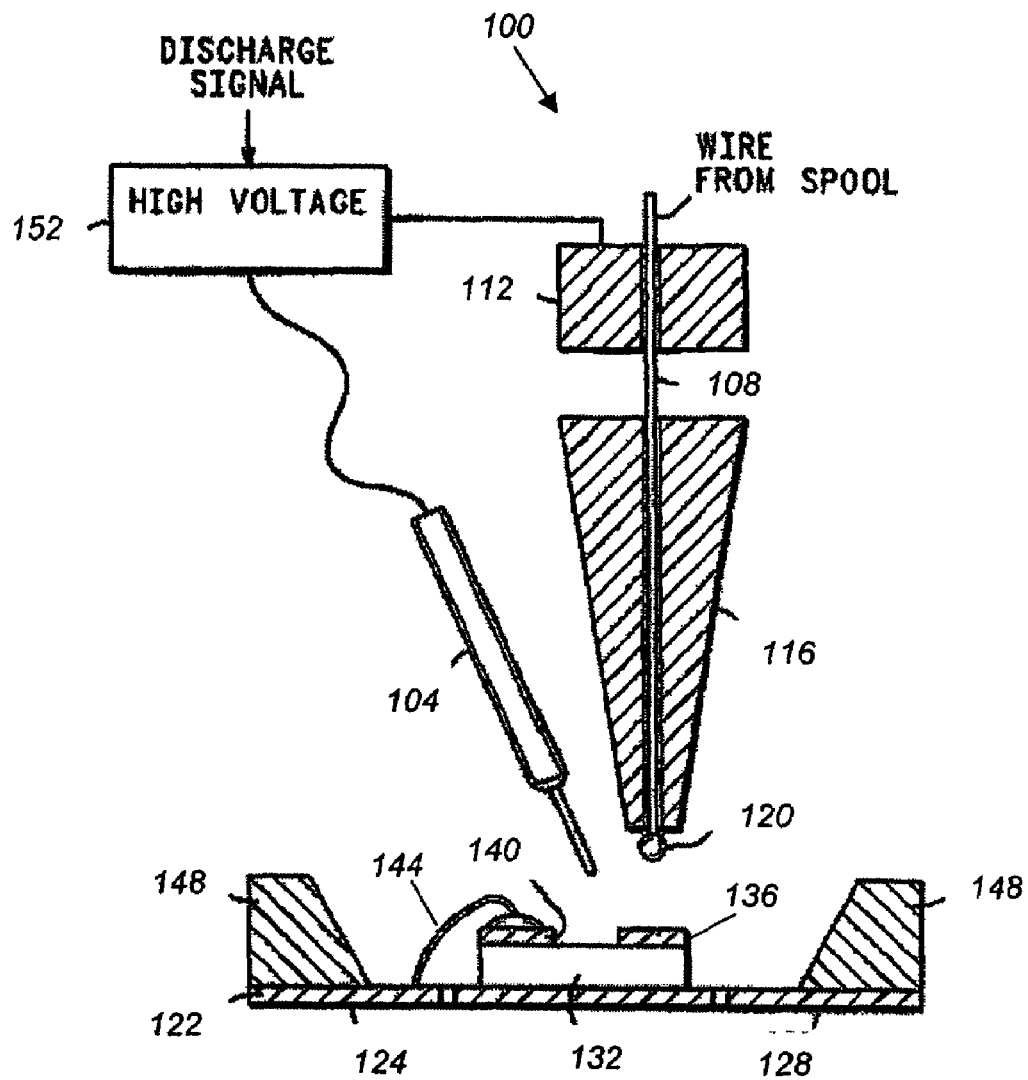
FIG. 1 is a prior art wire bonding apparatus.
Figure 2:
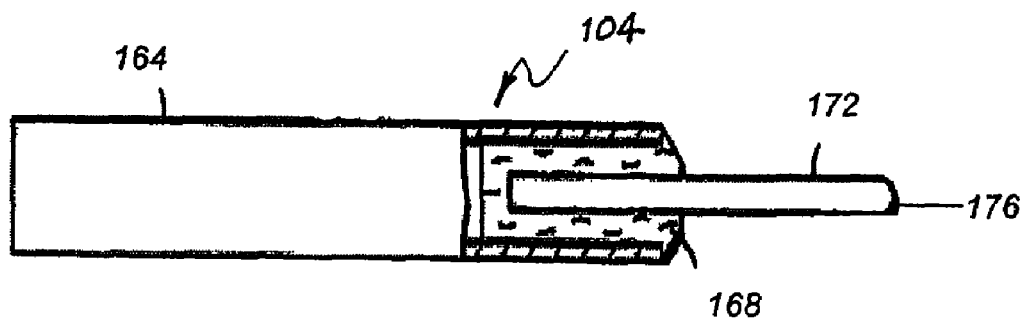
FIG. 2 is an electrode used in the apparatus of FIG. 1.

In the drawings, in which like numerals indicate like elements, there is shown an electrode for use in a wire bonding apparatus and an EFO wand assembly including an electrode constructed according to the principles of the present invention.

Figure 3:
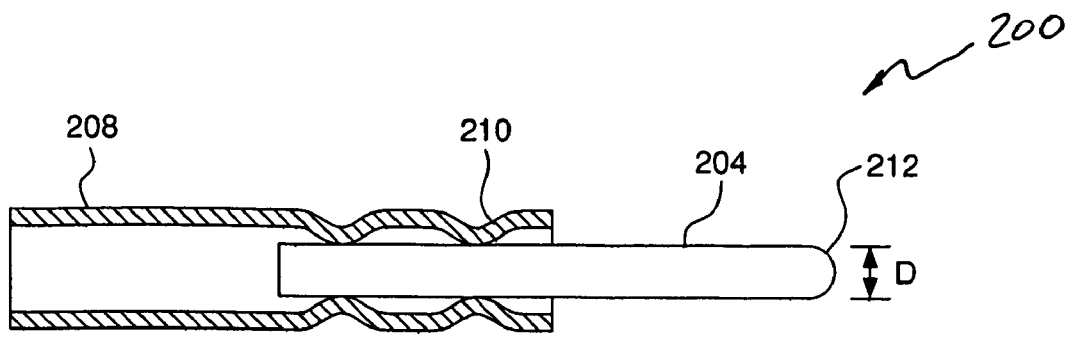
FIG. 3 is an electronic flame-off wand incorporating an electrode constructed according to an exemplary embodiment of the present invention.

FIG. 3 illustrates an EFO wand 200 that incorporates an electrode 204 constructed according to the principles of the present invention. The wand 200 includes a mounting section 208 and the electrode 204. The mounting section 208 is preferably rigid and electrically conductive. In one exemplary embodiment, the mounting section 208 is made from stainless steel. The mounting section 208 in this exemplary embodiment is a tube having an inner diameter of sufficient size to receive the electrode 204, which has an outer diameter, D. Preferably, the mounting section 208 is secured to the electrode 204 by crimping an end portion 210 of the mounting portion 208 as shown. It is not a requirement of the invention, however, that the mounting portion is secured to the electrode by crimping. Any suitable means could be used to secure the mounting portion 208 instead of crimping, such as adhesive, fastening, welding and the like.

The electrode 204 is mounted into the bore of the mounting section 208 such that a tip 212 of the electrode 208 is exposed outside the mounting section 208. The electrode 204 is in electrical communication with the mounting section 208 and emits an electrical discharge or arc from the tip 212. The arc forms a ball at the end of the bonding wire.

Figure 4A:
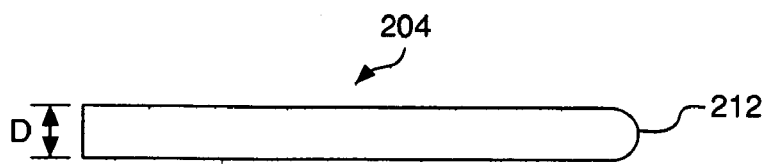
FIGS. 4A, 4B, and 4C are electrodes constructed according to various exemplary embodiments of the present invention.
Figure 4B:
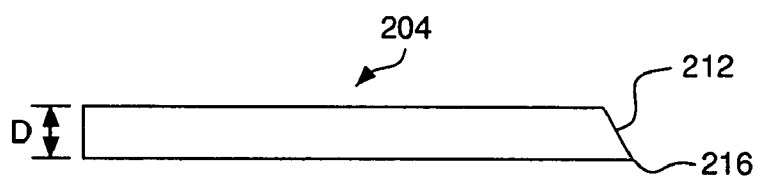
Figure 4C:
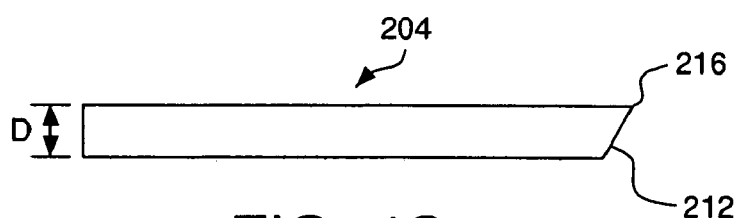

With reference to FIGS. 4A, 4B, and 4C, the electrode is shown in more detail. The electrode 204 is preferably formed from rigid construction and is electrically conductive. In one exemplary embodiment, the electrode is fabricated out of substantially pure iridium. In other exemplary embodiments, the electrode is fabricated out of an iridium alloy. The iridium alloy, for example, is a mixture of iridium and at least one other material such as rhodium, platinum, ruthenium, palladium, molybdenum, and tungsten. In one exemplary embodiment, the mixture is approximately 50 weight percent iridium and approximately 50 weight percent rhodium. In a preferred embodiment, the alloy is approximately 80 weight percent iridium and approximately 20 weight percent rhodium. However, depending on the use and efficiency desired, the combination of iridium and rhodium may include a percentage iridium between approximately 50% to 99% or more.

The diameter of the electrode 204 can vary depending on the desired result. In one exemplary embodiment, the diameter of the electrode 204 is less than approximately 0.020 inches. In a preferred embodiment, the diameter of the electrode 204 is approximately 0.010 inches. It should be readily apparent that the electrode may range in diameter from approximately 0.010 to 0.020 inches. The tip 212 can vary in shape. In certain applications it is desirable that the tip 212 not be blunt. In one exemplary embodiment, the tip 212 is rounded (see FIG. 4A). In alternate exemplary embodiments the tip 212 is cut at an angle (e.g., 45 degrees) to create a point 216 (See FIGS. 4B-4C).

An electrode constructed of an iridium alloy containing 80 weight percent iridium and 20 weight percent rhodium with a diameter of 0.010 inches having a rounded tip provides various advantages in wire bonding applications. The iridium alloy is harder and stiffer (i.e., it has a higher modulus) than a conventional platinum electrode. The harder iridium alloy increases the operational life of the electrode since the harder alloy is less easily damaged and the higher melting point allows for less susceptibility to electrical wear. In some applications, such an electrode is capable of forming in excess of twenty million balls on the end of the bonding wire before requiring replacement. Conventional electrodes typically are capable of forming approximately one million balls before maintenance must be performed due to the contamination build up. Also conventional electrodes must be "burned-in" by creating as many as 100,000 balls before optimal performance of the electrode is achieved.

The smaller diameter of 0.010 is also a factor in extending the usability of the electrode 204. A smaller diameter electrode reduces the surface area of the tip 212. During the arcing process, a small amount of plasma is created on the tip of the electrode. The plasma acts as a cleanser to assist in removing a portion of the contamination that forms on the tip. In the present invention, the reduced tip surface area means that the plasma removes a larger percentage of the contaminated material. As a result, a portion of the active surface area of the tip 212 is self-cleaned. A clean tip electrode yields more consistent ball diameters on the end of the wire during the wire bonding processes.

Figure 5:
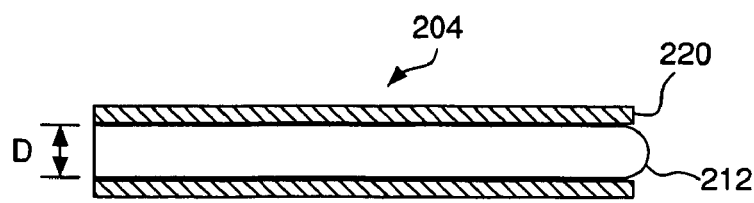
FIG. 5 is an illustration of the electrode of FIG. 4A having an insulative layer disposed thereon in accordance with an exemplary embodiment of the present invention.

With reference to FIG. 5, in another exemplary embodiment of the present invention, a layer of insulative material 220 is disposed on the iridium alloy. In such an embodiment, it is preferred that the tip 212 be rounded. The insulative layer 220 constrains the plasma field during the arcing time. The constrained plasma field concentrates the spark to a limited location on the electrode 204. As such, the plasma is generated closer to the tip, which is where the contamination occurs. Thus, the insulative material 220 increases the cleansing provided by the electrode, thereby producing more consistent balls over the life of the electrode. In one embodiment, the insulative material is a layer of glass having a thickness of approximately 0.002 inches. Alternatively, other materials such as, oxides, nitrides, silica, alumina, and other ceramics can be used. Additionally, high temperature polymers such as polyimide, bisbenzocyclobutene, polysulfones, and phenolics can be used.

The narrower tip that is provided in the present invention through the use of the iridium materials also permits the electrode to be positioned closer to the bonding location than is possible using prior electrodes. Furthermore, the smaller tip is also lighter than conventional electrodes, thus reducing the weight of the entire bonding assembly.

Referring to FIG. 6, there is shown an electrode 302 for an EFO wand according to another exemplary embodiment of the present invention. The electrode 302 includes a substantially spherical tip portion 304 and an elongated body portion 306. The electrode 302 is preferably made from platinum or iridium or an alloy of platinum or iridium. Such a platinum or iridium alloy includes at least one other material, for example, rhodium, platinum, ruthenium, palladium, molybdenum, and tungsten. According to a preferred process, a platinum or iridium wire is supported in a substantially vertical orientation and an end portion of the wire is melted, for example, using a torch or electric arc. Surface tension causes the melting end portion of the vertically-supported wire to assume the substantially spherical configuration of the tip portion 304. The wire is then maintained in the vertically-supported orientation while the tip portion 304 cools and solidifies.

Further, other exemplary materials that the electrode 302 may comprise include palladium, nickel, steel, gold, tungsten, molybdenum and alloys containing substantial portions of one or more of palladium, iron, nickel, chromium, gold, and rhodium. Examples of such alloys include stainless steel; nichrome (80%-nickel, 20%-chromium); 90%-platinum, 10%-iridium; 90%-platinum, 10% rhodium; and 40%-palladium, 60%-gold.

As shown, the spherical tip portion 304 of electrode 302 has a diameter that is greater than the diameter of the body portion 306 to which it is connected. The relative size of the tip, portion 304 and body portion 306 may vary from that shown. Preferably, however, the tip portion 304 has a diameter that is between approximately 1.3 to 4 times that of the body portion 306, and more preferably, between approximately 1.5 to 2.5 times that of the body portion 306. As a result, the surface area of the tip portion 304 is substantially increased compared to that of an electrode having a similarly sized body portion with an end that is simply rounded or angled.

The substantially spherical configuration for the tip portion 304 of electrode 302 focuses the electrical discharges from the electrode 302 at the terminal end of the electrode. The enlarged configuration of the tip portion 304 tends to contain the plasma cloud associated with an electrical discharge at the terminal end of the electrode and prevent it from traveling back to the body portion 306 of electrode 302.

As provided above, using a spherical tip portion tends to constrain the area of the wand that the plasma can cover. Without such a spherical tip portion, if the available area on the wand is much larger than the area that is covered by the plasma, the spark can wander over the wand during ball formation. This may cause the spark to be slightly different from one ball to the next, which may undesirably cause significant variations in the size of the ball.

To further control the area covered by the plasma for improving consistency of ball formation, and/OR to further limit potential for detrimental damage to the wand, the electrode 302 also includes an electrically insulating sleeve 308. For example, sleeve 308 may be an alumina tube that surrounds the body portion 306. Other exemplary materials used for sleeve 308 include glass, oxides, nitrides, silica, other ceramics, or high temperature polymers such as polyimide, bisbenzocyclobutene, polysulfones, and phenolics or alloys of any of the aforementioned materials.

By providing improved consistency in ball formation (e.g., using a spherical tip portion and/or an insulating sleeve), wire bonding performance for a fine pitch process is improved. For example, the apparatus disclosed herein has had excellent results in applications where the center to center distance between bonded balls on a die are less than about 45 microns.

The containment of plasma, and the associated focusing of the electrical discharge, to the terminal end of the electrode 302, results in greater predictability. Greater predictability provides for greater consistency for the electrical discharges generated by the electrode 302. Such improved consistency in the electrical discharges generated by the electrode 302 results in increased control and uniformity of free-air balls formed by the electrode 302 on bonding wire fed from a capillary.

Referring to FIG. 7; there is tabulated the results of two sample runs (i.e., Run #1, Run #2) of free-air balls (FABs) formed by an EFO wand including electrode 302. The electrode 302 used for the sample run was formed from an 8 mil diameter platinum wire. The spherical tip portion 304 of electrode 302 was formed by melting the platinum wire using a hydrogen-oxygen torch. The FABs of the sample run were made by directing electrical discharges from the electrode 302 to a 1 mil gold bolding wire, which is sold by Kulicke and Soffa Industries of Willow Grove, Pa. as AW99 wire.

Each of the two sample runs of free-air balls formed by electrode 302 included 400 FABs. As shown, the average ball diameter for the 400 FABs was 37.9 micrometers with a standard deviation of 0.25 micrometers for Run #1, and 37.6 micrometers with a standard deviation of 0.23 micrometers for Run #2. This is in sharp contrast to sample FAB runs formed using a conventional electrode where the standard deviation has been measured to be in the range of about 0.6 micrometers.

Referring to FIG. 8, the results of the sample Run #1 of FIG. 7 are shown for the 400 free-air balls formed on 1 mil AW99 wire using the electrode 302.

Figure 9:
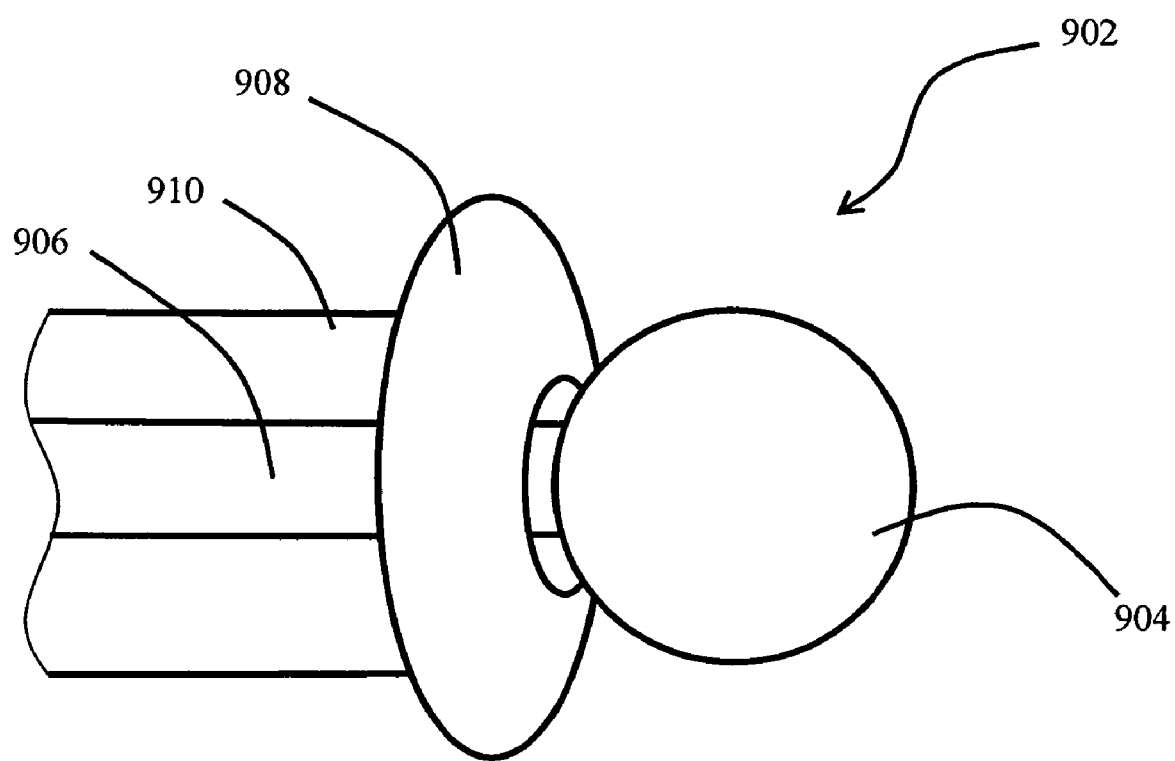
FIG. 9 is an illustration of an electrode having an insulative ring disposed thereon in accordance with an exemplary embodiment of the present invention.

As provided above, an insulative sleeve (e.g., insulative sleeve 308 illustrated in FIG. 6) may be provided to (1) improve the consistency of the portion of the wand covered by a plasma cloud to provide more consistently formed balls, and/or (2) prevent damage to the wand; however, the insulative material is not limited to a sleeve shape. For example, FIG. 9 illustrates an electrode 902 including body portion 906 and substantially spherical tip portion 904. An insulative ring 908 is disposed about body portion 906 towards substantially spherical tip portion 904. Insulative ring 908 may be provided to serve one or more of the above-recited functions of insulative sleeve 308 illustrated in FIG. 6. Insulative ring 908 may be formed from a number of materials including, for example, alumina, single-crystalline forms of alumina (e.g., sapphire, ruby), glass, oxides, nitrides, silica, other ceramics, or high temperature polymers such as polyimide, bisbenzocyclobutene, polysulfones, and phenolics, or alloys of any of the aforementioned materials. Also shown in FIG. 9 is the mounting tube 910 for the wand which may be formed of, for example, stainless steel.

The foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A wire bonding electrode comprising:
   a body portion; and
   a tip portion adjacent the body portion, the tip portion having a substantially spherical configuration, the tip portion defining an outer surface having a diameter that is greater than the largest diameter of an outer surface defined by the body portion, the wire bonding electrode being configured to be included in an electronic flame-off wand of a wire bonding machine.

2. The wire bonding electrode according to claim 1, wherein the tip portion has a diameter that is between approximately 1.3 to 4 times a diameter of the body portion.

3. The wire bonding electrode according to claim 1, wherein the tip portion has a diameter that is between approximately 1.5 to 2.5 times a diameter of the body portion.

4. The wire bonding electrode according to claim 1, wherein the electrode comprises a material selected from a group consisting of platinum, iridium, an alloy of platinum, and an alloy of iridium.

5. The wire bonding electrode according to claim 4, wherein the electrode is made from a platinum wire.

6. The wire bonding electrode according to claim 5, wherein the platinum wire from which the electrode is made has a diameter of approximately 8 mils.

7. The wire bonding electrode according to claim 1 further comprising an insulating sleeve defining an interior configured to receive the body portion of the electrode.

8. The wire bonding electrode according to claim 7, wherein the insulating sleeve comprises alumina.

9. The wire bonding electrode according to claim 1 further comprising an insulating ring defining an aperture therethrough, the insulating ring configured to be disposed about the body portion of the electrode adjacent the tip portion.

10. An electronic flame-off wand electrode comprising:
    a body portion; and
    a tip portion adjacent the body portion, the tip portion defining an outer surface having a diameter that is greater than the largest diameter of an outer surface defined by the body portion, the electronic flame-off wand electrode being configured to be included in an electronic flame-off wand of a wire bonding machine.

11. The electronic flame-off wand electrode according to claim 10, wherein the tip portion is substantially spherical in shape.

12. The electronic flame-off wand electrode according to claim 10, wherein the tip portion has a diameter that is between approximately 1.3 to 4 times a diameter of the body portion.

13. The electronic flame-off wand electrode according to claim 10, wherein the tip portion has a diameter that is between approximately 1.5 to 2.5 times a diameter of the body portion.

14. The electronic flame-off wand electrode according to claim 10 further comprising an insulating sleeve defining an interior configured to receive the body portion of the electrode.

15. The electronic flame-off wand electrode according to claim 10 further comprising an insulating ring defining an aperture therethrough, the insulating ring configured to be disposed about the body portion of the electrode adjacent the tip portion.

16. A wire bonding electrode comprising:

a body portion; and a tip portion adjacent the body portion, the tip portion being configured at an angle terminating at a point, the angle extending over the entire length of the tip portion such that the point is at an end of the tip portion, the wire bonding electrode being configured to be included in an electronic flame-off wand of a wire bonding machine.

17. The wire bonding electrode according to claim 16 further comprising an insulating sleeve defining an interior configured to receive the body portion of the electrode.

18. The wire bonding electrode according to claim 16 further comprising an insulating ring defining an aperture therethrough, the insulating ring configured to be disposed about the body portion of the electrode adjacent the tip portion.

* * * * *

UNITED STATES PATENT AND TRADEMARK OFFICE
CERTIFICATE OF CORRECTION

| | | |
|---|---|---|
| PATENT NO. | : 7,411,157 B2 | Page 1 of 1 |
| APPLICATION NO. | : 11/053499 | |
| DATED | : August 12, 2008 | |
| INVENTOR(S) | : Jon Brunner, Horst Clauberg and John Shuhart | |

It is certified that error appears in the above-identified patent and that said Letters Patent is hereby corrected as shown below:

On the Title page of the patent, Section (60) should be added under "Related U.S. Application Data" to read "Provisional Application No. 60/506,269, filed September 26, 2003".

At Column 1, lines 7-10. "This is a continuation-in-part of application Serial No. 10/948,905, filed September 24, 2004 (entitled "FINE PITCH ELECTRONIC FLAME-OFF WAND ELECTRODE"), which is incorporated by reference in its entirety." should read -- This is a continuation-in-part of application Serial No. 10/948,905, filed September 24, 2004 (entitled "FINE PITCH ELECTRONIC FLAME-OFF WAND ELECTRODE"), which claims priority to U.S. Provisional Patent Application No. 60/506,269, filed on September 26, 2003. --

Signed and Sealed this

Third Day of March, 2009

JOHN DOLL
*Acting Director of the United States Patent and Trademark Office*